(12) United States Patent
Tokumaru et al.

(10) Patent No.: US 7,701,373 B2
(45) Date of Patent: Apr. 20, 2010

(54) CURRENT STEERING DAC

(75) Inventors: Michiko Tokumaru, Osaka (JP); Heiji Ikoma, Nara (JP)

(73) Assignee: Panasonic Corporation, Osaka (JP)

( * ) Notice: Subject to any disclaimer, the term of this patent is extended or adjusted under 35 U.S.C. 154(b) by 25 days.

(21) Appl. No.: 12/089,699

(22) PCT Filed: Mar. 13, 2006

(86) PCT No.: PCT/JP2006/304923

§ 371 (c)(1),
(2), (4) Date: Apr. 9, 2008

(87) PCT Pub. No.: WO2007/046159

PCT Pub. Date: Apr. 26, 2007

(65) Prior Publication Data

US 2009/0045993 A1    Feb. 19, 2009

(51) Int. Cl.
*H03M 1/66* (2006.01)
(52) U.S. Cl. .................................. 341/144; 341/120
(58) Field of Classification Search ............. 341/144, 341/143, 145, 118, 120
See application file for complete search history.

(56) References Cited

U.S. PATENT DOCUMENTS

| 5,489,902 | A  | * | 2/1996  | Shyu et al. ............ 341/136 |
| 6,353,402 | B1 |   | 3/2002  | Kanamori |
| 6,590,516 | B2 | * | 7/2003  | Inagaki et al. ........ 341/144 |
| 6,639,533 | B2 | * | 10/2003 | Moon ................... 341/144 |
| 7,312,740 | B2 | * | 12/2007 | Chou ................... 341/145 |

FOREIGN PATENT DOCUMENTS

| JP | 2-311027    | 12/1990 |
| JP | 8-274642    | 10/1996 |
| JP | 2794786     | 6/1998  |
| JP | 2001-136068 | 5/2001  |
| JP | 2003-258641 | 9/2003  |
| JP | 2004-186999 | 7/2004  |
| JP | 2006-67617  | 3/2006  |

\* cited by examiner

*Primary Examiner*—Brian Young
(74) *Attorney, Agent, or Firm*—McDermott Will & Emery LLP

(57) ABSTRACT

A multi-channel current steering DAC (Digital-to-Analog Converter), for example, a 2-channel current steering DAC, includes a plurality of current sources I1, I2, . . . corresponding to the number of bits of a digital input signal DS in each of channels A, B. Each of the plurality of current sources I1, I2, . . . is formed by two small-current sources (I11, I12), (I21, I22), . . . . In the case where a full-scale current is limited to a small value in any of the channels, one of the two divided current sources is turned off by switches Sa1, Sa2. Accordingly, a full-scale current of each channel can be adjusted with a common bias circuit without degrading the resolution.

10 Claims, 8 Drawing Sheets

US 7,701,373 B2

CURRENT STEERING DAC

RELATED APPLICATIONS

This application is the U.S. National Phase under 35 U.S.C. 371 of International Application No. PCT/JP2006/304923, filed on Mar. 13, 2006, which in turn claims the benefit of Japanese Patent Application No. JP 2005-301356, filed on Oct. 17, 2005, the disclosures of which Applications are incorporated by reference herein.

TECHNICAL FIELD

The invention relates to a current steering DAC (Digital-to-Analog Converter). More particularly, the invention relates to measures for reducing unnecessary power consumption.

BACKGROUND ART

Dimensional reduction has been ongoing in a semiconductor process. Unlike a digital circuit block, however, such dimensional reduction in a process does not result in reduction in area of an analog circuit block. Moreover, since an LSI (Large Scale Integrated circuit) has multiple functions, power consumption has been increasing and reduction in power consumption has been a big challenge.

Conventionally, a current steering DAC has a plurality of unit current sources corresponding to the number of bits of a digital input signal, and a bias circuit for generating a bias voltage for adjusting current values of the unit current sources to a prescribed value. When a digital input signal is applied to the current steering DAC, the current steering DAC selects currents to be applied from the plurality of unit current sources to an analog output terminal according to the digital input signal. The current steering DAC then sums the selected currents and outputs the sum from the analog output terminal.

A multi-channel current steering DAC is a current steering DAC for multiple use having a plurality of channels of the same structure. In many of such multi-channel current steering DACs, the bias circuit is shared by the plurality of channels in order to reduce the area.

FIG. 8 shows an example of the structure of a current steering DAC. In FIG. 8, I1, I2, . . . indicate a plurality of current sources, DS indicates a digital input signal, 1 indicates a bias circuit, 3 indicates an analog output terminal, 4 indicates a stabilizing capacitor, and SW1, SW2, . . . indicate switch circuits. Each switch circuit SW1, SW2, . . . switches a current of a corresponding current source I1, I2, . . . between an analog output terminal 3 and the ground according to the value of a digital input signal DS.

This current steering DAC includes a plurality of current sources I1, I2, . . . corresponding to the number of bits of the digital input signal DS. For example, a thermometer-type current steering DAC includes 256 current sources in the case of an 8-bit digital input signal DS and includes 1,024 current sources in the case of a 10-bit digital input signal DS. A binary-type current steering DAC includes eight weighted current sources in the case of an 8-bit digital input signal DS. The switch circuits SW1, . . . are switched according to the value of the digital input signal DS so that a current corresponding to the value of the digital input signal DS flows into the analog output terminal 3 and an analog output is obtained. A stabilizing capacitor 4 for reducing an impact of noise such as crosstalk is connected in an output path of a bias voltage from a bias circuit 1.

The switch circuits SW1, . . . are usually formed by transistors. FIG. 9 shows an example of the switch circuit SW1. In FIG. 9, the digital input signal DS is decoded by a decoder 10 and the decoded digital signal is applied to the gate of one of two Pch transistors P1 and P2 of the switch circuit SW1, that is, to the gate of the Pch transistor P1. The decoded digital signal is applied to the gate of the other Pch transistor P2 through an inverter. In the case where a corresponding value of the decoded digital signal is at "L" level, the Pch transistor P1 is turned on and connects a current of the current source I1 to the analog output terminal 3. In the case where a corresponding value of the inverted decoded digital signal is at "H" level, the other Pch transistor P2 is turned on and a current of the current source I1 is connected to the ground.

FIG. 10 shows the structure of a multi-channel current steering DAC. In the example of FIG. 10, the current steering DAC has two channels A, B. A bias voltage output from the bias circuit 1 is shared for current adjustment of each current source in the two channels A, B.

Conventionally, an example of a method for changing a full-scale current in such a multi-channel current steering DAC is to switch the bias voltage of the bias circuit. A full-scale current is the sum of currents flowing from all the current sources to the analog output terminal. For example, in Patent document 1, a full-scale current is changed by changing a current value of each current source by switching a bias voltage generated by a bias circuit.

Patent document 1: Japanese Laid-Open Patent Publication No. 8-274642 (pp. 3-4, FIG. 1)

DISCLOSURE OF THE INVENTION

Problems to be Solved by the Invention

In the conventional multi-channel current steering DAC, however, the bias circuit is shared by a plurality of channels. Therefore, a full-scale current of each channel is uniquely determined by the bias circuit and cannot be changed independently. Accordingly, product design is performed according to the case where the highest full-scale current is required. As a result, when the full-scale current is required by only one channel, the full-scale current is not only consumed by that channel but is unnecessarily consumed all the time by other channels that do not require the full-scale current. This results in an unnecessary increase in current consumption. Moreover, in order to change the full-scale current in a single-channel current steering DAC or in every channel of a multi-channel current steering DAC by changing the bias voltage, it is necessary to charge and discharge the capacitor for stabilizing the bias voltage, which is time-consuming.

Means for Solving the Problems

The invention is made to solve the above problems, and a multi-channel current steering DAC according to the invention includes a plurality of current sources in each channel. Each of the plurality of current sources is formed by a plurality of small-current sources, and at least one of the plurality of small-current sources can be turned off as required.

More specifically, according to an aspect of the invention, a current steering DAC having a plurality of channels includes in each channel a plurality of unit current sources corresponding to a number of bits of a digital input signal. In each channel, the current steering DAC turns on/off the plurality of unit current sources according to a value of the digital input signal and outputs a sum of currents of the turned-on unit current sources from an analog output terminal. The current steering DAC includes a bias circuit shared by the plurality of channels, for generating a bias voltage for setting a current value of the plurality of unit current sources. In at least one of the plurality of channels, each of the plurality of unit current sources is formed by a plurality of divided current sources, and the current steering DAC includes a plurality of cascode portions respectively corresponding to the divided current sources and a control circuit for controlling the cascode portions so as to turn off at least one of the plurality of divided current sources in each unit current source.

In the above current steering DAC, the plurality of divided current sources of each unit current source have a same current value.

In the above current steering DAC, the plurality of divided current sources of each unit current source have different current values.

In the above current steering DAC, each unit current source is formed by two divided current sources.

In the above current steering DAC, the bias circuit applies the bias voltage to the plurality of divided current sources of each unit current source, and the control circuit includes a selection circuit for stopping supply of the bias voltage from the bias circuit to at least one of the plurality of cascode portions in each unit current source.

In the above current steering DAC, each divided current source is formed by a P-type transistor connected to a power supply of a prescribed power supply voltage, each cascode portion is formed by a P-type transistor connected to a corresponding divided current source, and the control circuit includes a selection circuit for supplying an on-bias voltage for turning on the P-type transistor and an off-bias voltage for turning off the P-type transistor to the P-type transistor of each divided current source.

In the above current steering DAC, the off-bias voltage that is supplied from the control circuit to the P-type transistor is the power supply voltage of the power supply.

In the above current steering DAC, each divided current source is formed by an N-type transistor connected to a ground power supply, each cascode portion is formed by an N-type transistor connected to a corresponding divided current source, and the control circuit includes a selection circuit for supplying an on-bias voltage for turning on the N-type transistor and an off-bias voltage for turning off the N-type transistor to the N-type transistor of each divided current source.

In the above current steering DAC, the off-bias voltage that is supplied from the control circuit to the N-type transistor is a ground voltage of the ground power supply.

According to an aspect of the invention, a current steering DAC having a plurality of channels includes in each channel a plurality of unit current sources corresponding to a number of bits of a digital input signal. In each channel, the current steering DAC turns on/off the plurality of unit current sources according to a value of the digital input signal and outputs a sum of currents of the turned-on unit current sources from an analog output terminal. The current steering DAC includes a bias circuit shared by the plurality of channels, for generating a bias voltage for setting a current value of the plurality of unit current sources. In at least one of the plurality of channels, each of the plurality of unit current sources in each channel is formed by a plurality of divided current sources, and the current steering DAC includes: a plurality of switch circuits provided respectively corresponding to the divided current sources, for selecting whether to output a current of a corresponding divided current source to the analog output terminal according to the digital input signal; and a control circuit for turning off at least one of the plurality of divided current sources in each unit current source. The control circuit opens at least one of the plurality of switch circuits respectively corresponding to the plurality of divided current sources of each unit current source by outputting a selection signal, and thus turns off a corresponding divided current source.

In the above current steering DAC, each switch circuit includes a first transistor connected to a corresponding divided current source and the analog output terminal, a second transistor connected to the corresponding divided current source and a ground power supply, a first logic circuit connected to a gate of the first transistor and receiving the digital input signal and the selection signal from the control circuit, and a second logic circuit connected to a gate of the second transistor and receiving an inverted signal of the digital input signal and the selection signal from the control circuit.

According to an aspect of the invention, a current steering DAC includes a plurality of unit current sources corresponding to a number of bits of a digital input signal. The current steering DAC turns on/off the plurality of unit current sources according to a value of the digital input signal and outputs a sum of currents of the turned-on unit current sources from an analog output terminal. The current steering DAC includes a bias circuit for generating a bias voltage for setting a current value of the plurality of unit current sources. Each of the plurality of unit current sources is formed by a plurality of divided current sources. The current steering DAC further includes: a plurality of cascode portions respectively corresponding to the divided current sources; and a control circuit for controlling the cascode portions so as to turn off at least one of the plurality of divided current sources in each unit current source.

According to an aspect of the invention, a current steering DAC includes a plurality of unit current sources corresponding to a number of bits of a digital input signal. The current steering DAC turns on/off the plurality of unit current sources according to a value of the digital input signal and outputs a sum of currents of the turned-on unit current sources from an analog output terminal. The current steering DAC includes a bias circuit for generating a bias voltage for setting a current value of the plurality of unit current sources. Each of the plurality of unit current sources is formed by a plurality of divided current sources. The current steering DAC further includes: a plurality of switch circuits provided respectively corresponding to the divided current sources, for selecting whether to output a current of a corresponding divided current source to the analog output terminal according to the digital input signal; and a control circuit for controlling the switch circuits so as to turn off at least one of the plurality of divided current sources in each unit current source.

As has been described above, in the current steering DAC of the invention, each of the plurality of unit current sources is formed by two or more divided current sources in each channel, and a full-scale current of each channel is limited to a small value by turning off at least one of the two or more divided current sources in each unit current source. Moreover, even when a full-scale current is limited to a small value, at least one divided current source is operating in each of the plurality of unit current sources corresponding to the number of bits of the digital input signal. Therefore, the resolution of the current steering DAC is not degraded. Moreover, since each unit current source is formed by two or more divided current sources with approximately the same area as the unit current source, the cost of the current steering DAC can be suppressed.

In the current steering DAC of the invention, a full-scale current can be variably adjusted only by a control signal of the internal control signal without changing the bias voltage of the bias circuit and the like.

EFFECTS OF THE INVENTION

As has been described above, a multi-channel current steering DAC of the invention is capable of adjusting a full-scale current of each channel without degrading the resolution. Accordingly, unnecessary power consumption can be effectively reduced.

The current steering DAC of the invention is capable of variably adjusting a full-scale current only by a current signal of an internal control circuit.

DESCRIPTION OF THE REFERENCE NUMERALS

| | |
|---|---|
| 1, 1' | bias circuit |
| 3 | analog output terminal |
| 4 | stabilizing capacitor |
| 7 | control circuit |
| 10 | decoder |
| DS | digital input signal |
| BS | bias voltage signal |
| I1, I2 | unit current source |
| I11, I12 | divided current source |
| Sa1, Sa2, Sa1', Sa2' | selection circuit |
| P11-P22 | Pch transistor |
| N11-N22 | Nch transistor |
| vps | power supply |
| Cd11-Cd22 | cascode transistor |
| SW1, SW2 | switch circuit |
| SW11, SW12 | divided switch circuit |
| sel1A, sel2A | on/off control signal |
| T1 | first transistor |
| T2 | second transistor |
| 12 | first NAND circuit (logic circuit) |
| 13 | second NAND circuit (logic circuit) |

BEST MODE FOR CARRYING OUT THE INVENTION

Hereinafter, embodiments of the invention will be described with reference to the accompanying drawings.

First Embodiment

Figure 1:
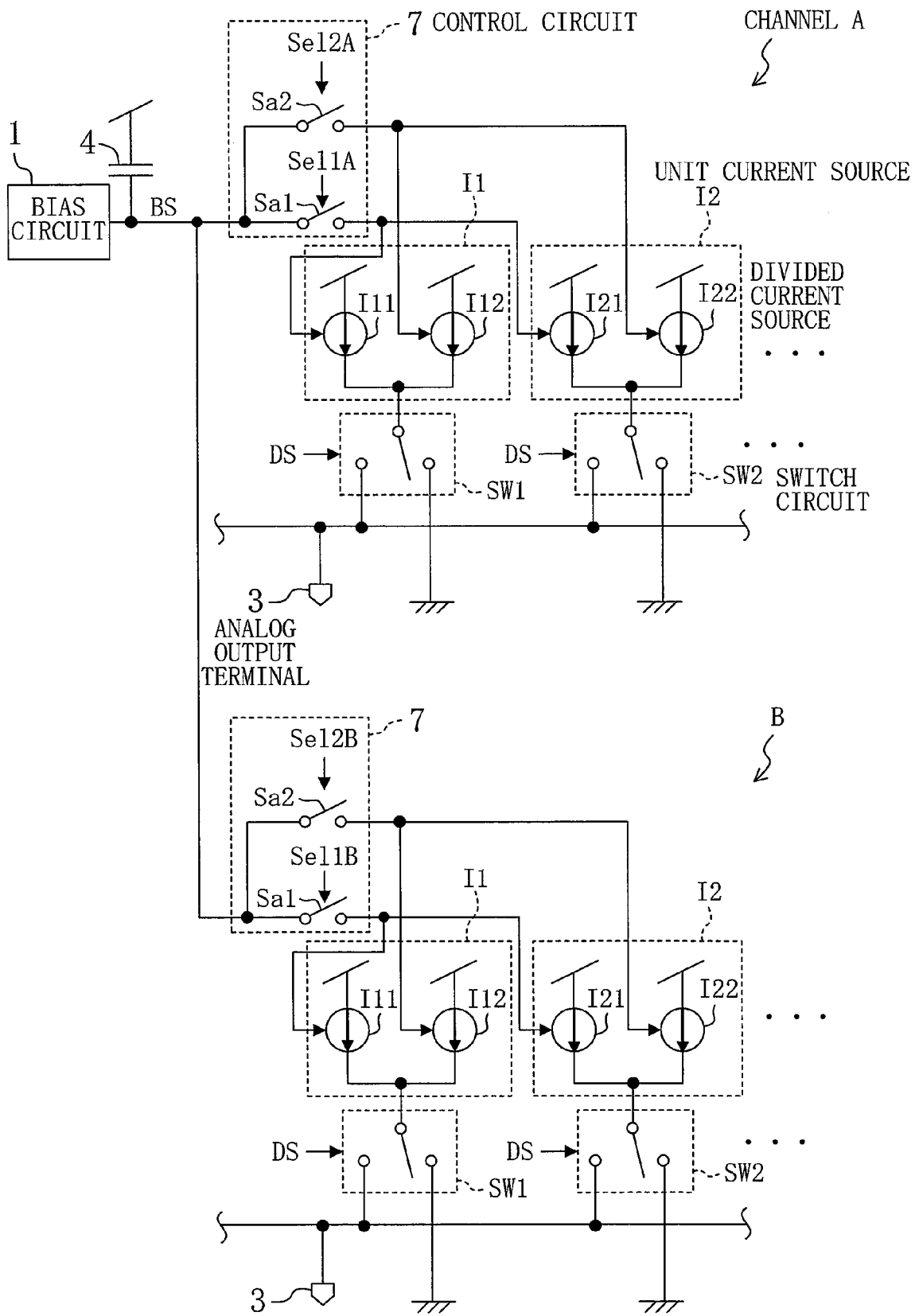
FIG. 1 shows the overall structure of a current steering DAC according to a first embodiment.

FIG. 1 shows the structure of a current steering DAC according to a first embodiment of the invention.

The current steering DAC of FIG. 1 is a 2-channel current steering DAC. Since two channels A, B have the same structure, only the channel A will be described below.

In the channel A, 1 indicates a bias circuit that is shared with the channel B, and DS indicates a digital input signal. I1, I2, . . . indicate unit current sources. The number of unit current sources correspond to the number of bits of the digital input signal DS. In the case of a thermometer-type current steering DAC, each channel includes 256 unit current sources in the case of an 8-bit digital input signal DS and includes 1,024 unit current sources in the case of a 10-bit digital input signal DS. In the case of a binary-type current steering DAC, each channel includes eight weighted unit current sources in the case of an 8-bit digital input signal DS. Only two unit current sources are shown in FIG. 1.

SW1, SW2, . . . indicate switch circuits. The number of switch circuits is the same as the number of unit current sources I1, I2, . . . . The switch circuits SW1, SW2, are controlled by the digital input signal DS. 3 indicates an analog output terminal. The unit current sources I1, I2, . . . are connected to the analog output terminal 3 through the corresponding switch circuits SW1, SW2, . . . . Each of the switch circuits SW1, SW2, switches a corresponding one of the unit current sources I1, I2, . . . between the analog output terminal 3 and the ground.

Each unit current source I1, I2, . . . is formed by two divided current sources (I11, I12), (I21, I22), . . . . The bias circuit 1 supplies a bias voltage signal BS to the divided current sources (I11, I12), (I21, I22), . . . of each unit current source I1, I2, . . . . The bias voltage signal BS is a signal for setting a current value of each unit current source I1, I2, . . . . The current values of the divided current sources in each unit current source are set to the same value. A stabilizing capacitor 4 and a control circuit 7 are connected in a supply path of the bias voltage signal BS. The stabilizing capacitor 4 stabilizes the bias voltage signal BS to a fixed value. The control circuit 7 has two selection circuits Sa1, Sa2. The number of selection circuits is the same as the number of divided current sources in each unit current source I1, I2, . . . . One selection circuit Sa1 is provided in a supply path of the bias voltage signal BS to first divided current sources I11, I12, . . . of the unit current sources I1, I2, . . . . The other selection circuit Sa2 is provided in a supply path of the bias voltage signal BS to second divided current sources I12, I22, . . . of the unit current sources I1, I2, . . . . These selection circuits Sa1, Sa2 are respectively controlled by on/off selection signals Sel1A, Sel2A from the control circuit 7.

In the channel B, the control circuit 7 outputs on/off selection signals Sel1B, Sel2B to the selection circuits Sa1, Sa2, respectively. The on/off selection signals Sel1B, Sel2B are different from the on/off selection signals Sel1A, Sel2A in the channel A.

In this embodiment, a full-scale current of the current steering DAC in the case where all the unit current sources I1, I2, . . . are on is the sum of currents that flow from all the unit current sources I1, I2, . . . to the analog output terminal 3.

It is now assumed that a full-scale current that is one-half of a full-scale current of the channel B is required in the channel A. In this case, the control circuit 7 opens only the selection circuit Sa2 by the on/off selection signal Sel2A to stop only the respective second divided current sources I12, I22, . . . of the unit current sources I1, I2, . . . . As a result, only the respective first divided current sources I11, I21, . . . of the unit current sources I1, I2, . . . operate and the full-scale current of the channel A becomes one-half of the full scale current of the channel B. Unnecessary power consumption in the channel A can thus be reduced.

Moreover, since the respective first divided current sources I11, I21, . . . operate in the unit current sources I1, I2, . . . , resolution is not degraded.

Second Embodiment

Hereinafter, a second embodiment of the invention will be described.

Figure 2:
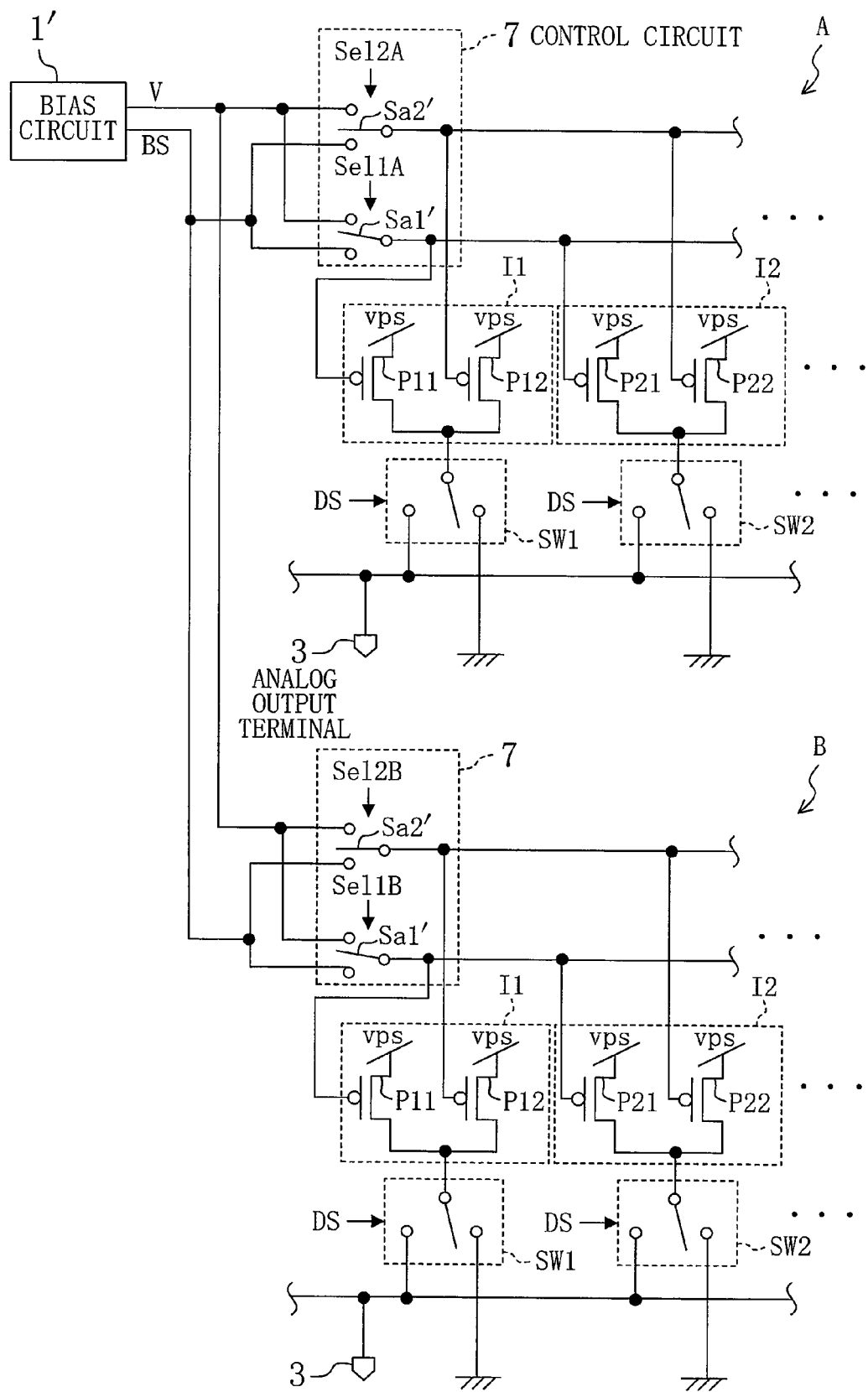
FIG. 2 specifically shows the structure of a current steering DAC according to a second embodiment.

FIG. 2 shows the structure of a current steering DAC according to the second embodiment of the invention.

In the current steering DAC of FIG. 2, divided current sources I11, I12, I21, I22, . . . are respectively formed by Pch transistors P11, P12, P21, P22, . . . . The respective sources of the Pch transistors P11, P12, P21, P22, . . . are connected to a power supply vps having a prescribed power supply voltage. The respective drains of two Pch transistors (first and second divided current sources) P11, P12 of the unit current source I1 are connected to a switch circuit SW1, and the respective drains of two Pch transistors (first and second divided current sources) P21, P22 of the unit current source I2 are connected to a switch circuit SW2.

A bias circuit 1' outputs a bias voltage signal BS for setting a current value of each unit current source I1, I2, . . . , that is, an on-bias voltage for turning on each divided current source I11, I12, . . . (Pch transistors P11, P12, . . . ). The bias circuit 1' also outputs an off-bias voltage for turning off each divided current source I11, I12, . . . . The off-bias voltage is set to a power supply voltage v of the power supply vps. A selection circuit Sa1' switches a voltage to be applied to the respective gates of the first divided current sources (Pch transistors P11, P21, . . . ) between the on-bias voltage BS and the off-bias voltage v from the bias circuit 1'. Similarly, a selection circuit Sa2' switches a voltage to be applied to the respective gates of the second divided current sources (Pch transistors P12, P22, . . . ) between the on-bias voltage BS and the off-bias voltage v from the bias circuit 1'. Since the structure is otherwise the same as the first embodiment, description thereof will be omitted.

For example, in the case where both selection circuits Sa1', Sa2' select the on-bias voltage BS in the channel A of the current steering DAC of this embodiment, a full-scale current is the sum of current values that are obtained when all the first and second Pch transistors P11, P12, P12, P22, . . . of the unit current sources I1, I2, . . . are turned on.

On the other hand, in the case where one selection circuit Sa2' selects the off-bias voltage v, the respective second Pch transistors P12, P22, . . . of the unit current sources I1, I2, . . . are turned off. Therefore, a full-scale current is the sum of current values that are obtained when only the respective first Pch transistors P11, P21, . . . of the unit current sources I1, I2, . . . are turned on.

Accordingly, in the current steering DAC of this embodiment, a full-scale current of each channel A, B can be adjusted without degrading the resolution.

Note that the bias voltage signal BS from the bias circuit 1' is a voltage for turning on the Pch transistors P11, P12, . . . . In order to obtain a desired current value of these transistors P11, P12, . . . , this voltage needs to be accurately set to a target value. On the other hand, the off-bias voltage v may be set within a voltage range that can turn off the Pch transistors P11, . . . and does not need to be accurately set to a single value. Therefore, it is easy when the off-bias voltage v is set to the power supply voltage v of the power supply vps.

Figure 3:
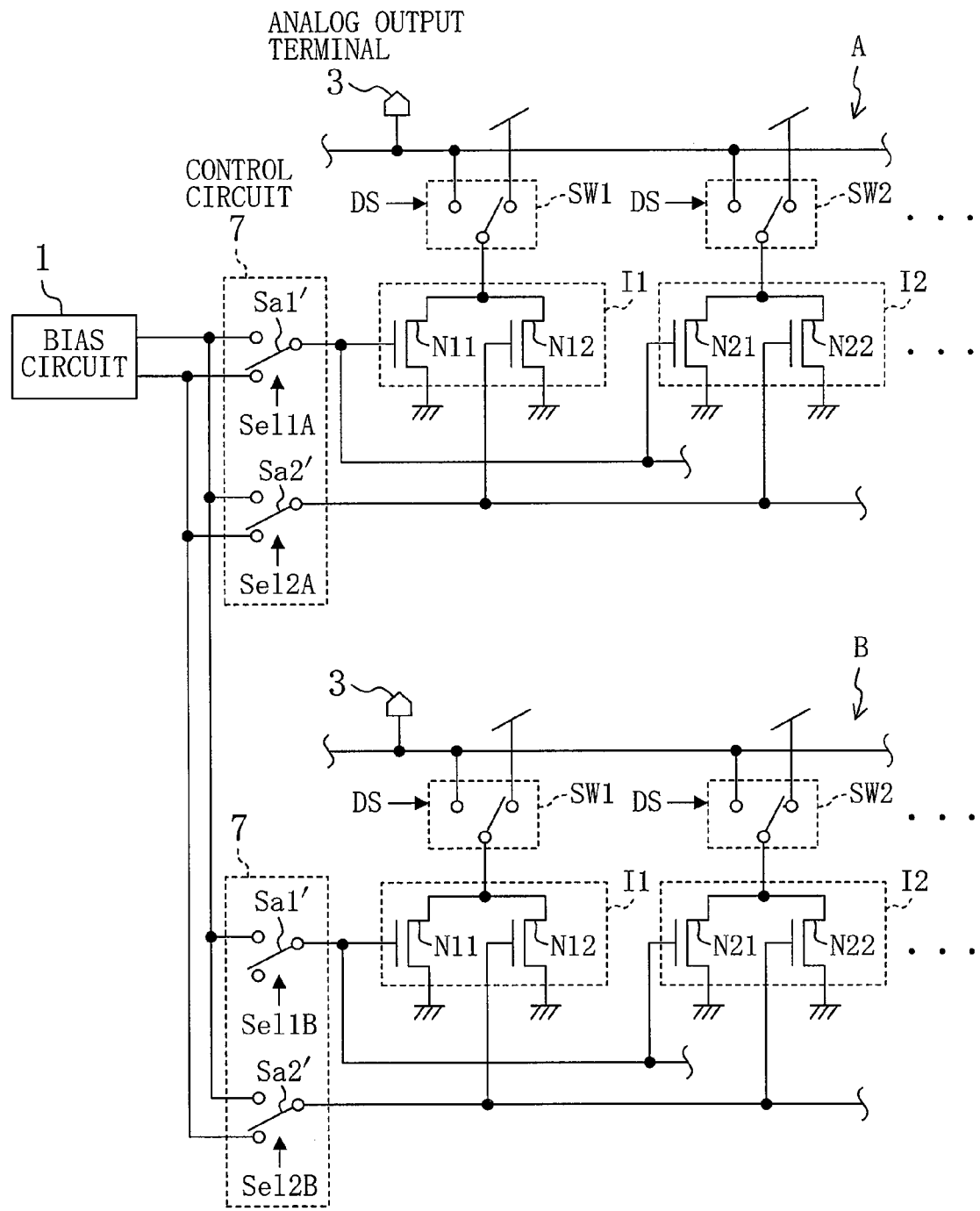
FIG. 3 shows a modification of the current steering DAC of the second embodiment.

FIG. 3 shows a modification of the second embodiment. In the second embodiment, the divided current sources of the current steering DAC are formed by Pch transistors. In this modification, however, the divided current sources of the current steering DAC are formed by Nch transistors. With this change, the power supply voltage and the ground voltage are reversed in this modification with respect to the second embodiment. Since the structure of this modification is otherwise the same as the second embodiment, description thereof will be omitted.

Note that, in FIGS. 1 through 3, the selection circuits Sa1, Sa2, Sa1', Sa2' are provided in both a supply path of the bias voltage signal BS from the bias circuit 1, 1' to the first divided current sources I11, I21, . . . and a supply path of the bias voltage signal BS from the bias circuit 1, 1' to the second divided current sources I12, I22, . . . . However, the selection circuits Sa1, Sa2, Sa1', Sa2' may alternatively be provided in one of the supply paths.

Third Embodiment

Figure 4:
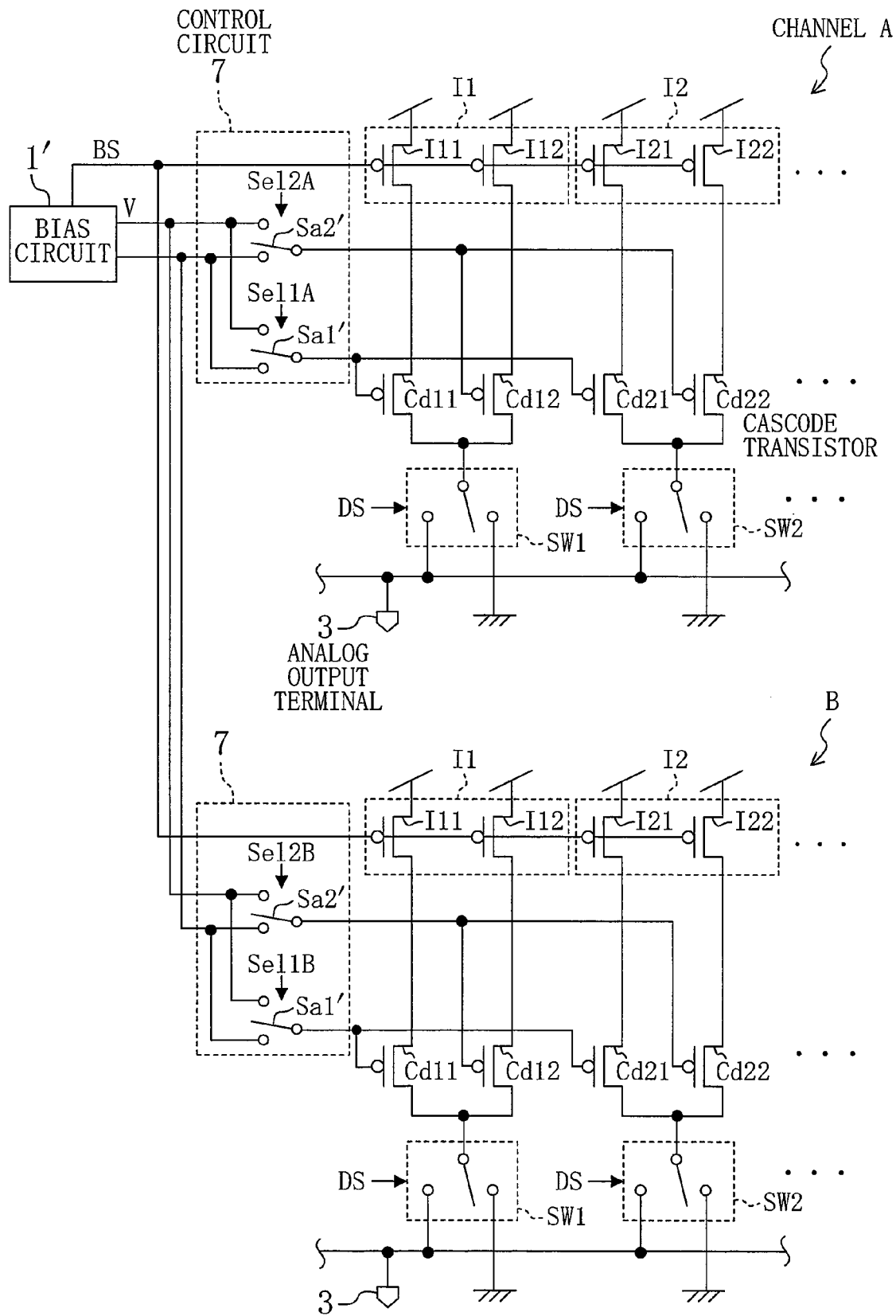
FIG. 4 specifically shows the structure of a current steering DAC according to a third embodiment.

FIG. 4 shows the structure of a current steering DAC according to a third embodiment of the invention.

The current steering DAC of FIG. 4 is a modification of the current steering DAC of FIG. 2.

More specifically, a bias circuit 1' supplies an on-bias voltage signal BS to divided current sources I11, I12, . . . formed by Pch transistors. First and second cascode transistors Cd11, Cd12, . . . are formed by Pch transistors. The respective sources of the first and second cascode transistors Cd11, Cd12, . . . are connected in series with the divided current sources I11, I12, . . . , respectively. A corresponding switch circuit SW1, SW2 is connected to the respective drains of the cascode transistors Cd11, Cd12, . . . .

A selection circuit Sa1' switches a voltage to be applied to the respective gates of the first cascode transistors Cd11, Cd21, . . . between the on-bias voltage BS and the off-bias voltage v from the bias circuit 1'. A selection circuit Sa2' switches a voltage to be applied to the respective gates of the second cascode transistors Cd12, Cd22, . . . between the on-bias voltage BS and the off-bias voltage v from the bias circuit 1'. Since the structure is otherwise the same as the first embodiment, description thereof will be omitted.

Accordingly, in the current steering DAC of this embodiment, each divided current source I11, I12, . . . can be turned on/off by turning on/off the respective cascode transistor Cd11, Cd12, . . . and a full-scale current of each channel A, B can be adjusted. Moreover, since corresponding cascode transistors Cd11, Cd12, . . . are connected in series with the divided current sources I11, I12, . . . , a current from each divided current source I11, I12, . . . can be made more constant.

Note that the current steering DAC may have only one of the selection circuits Sa1', Sa2'.

Figure 5:
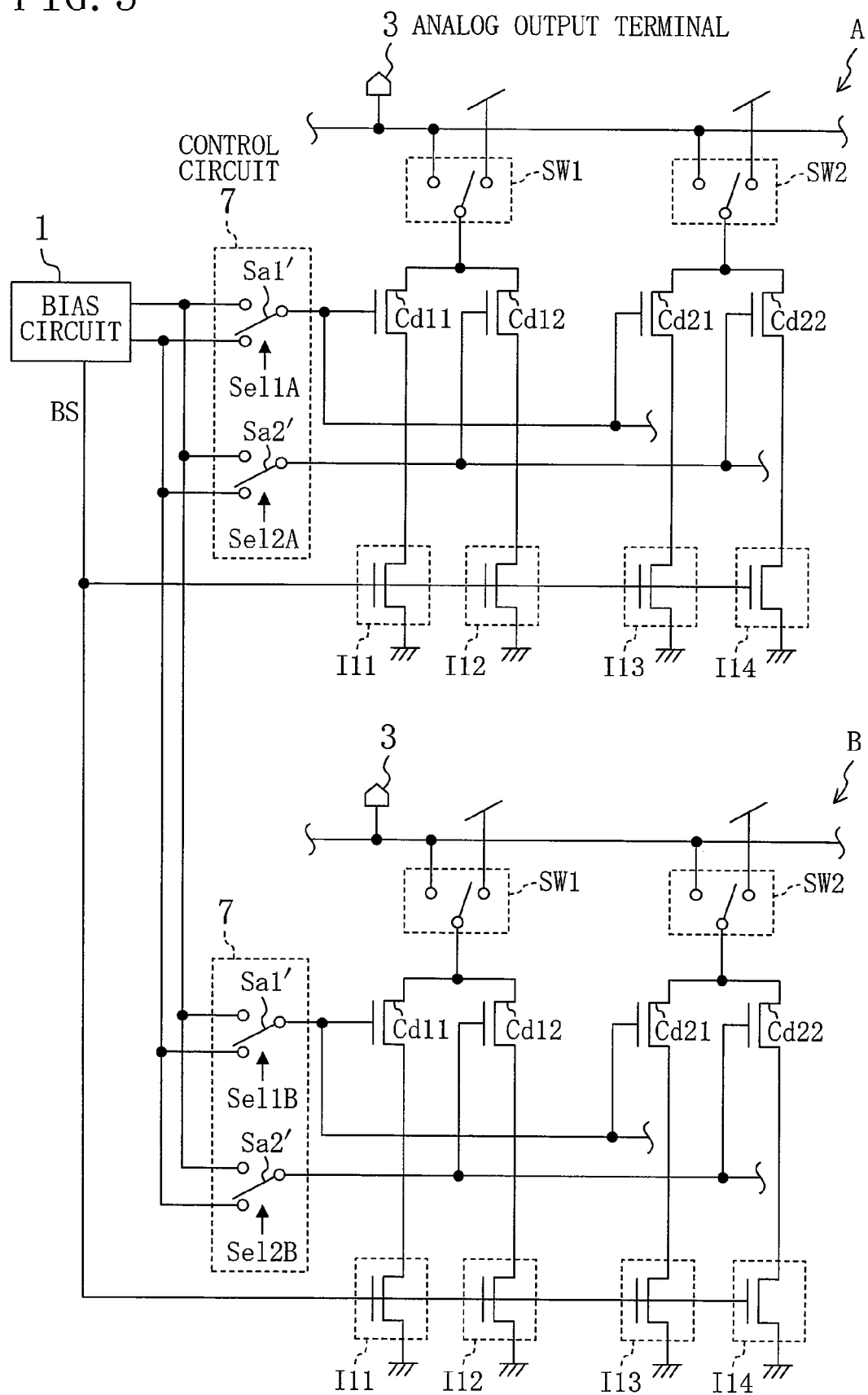
FIG. 5 is a modification of the current steering DAC of the third embodiment.

FIG. 5 shows a modification of this embodiment. In the third embodiment of FIG. 4, the divided current sources I11, I12, . . . and the cascode transistors Cd11, Cd12, . . . are formed by Pch transistors. In this modification, however, the divided current sources I11, I12, . . . and the cascode transistors Cd11, Cd12, . . . are formed by Nch transistors. With this change, the power supply voltage and the ground voltage are reversed in this modification with respect to the third embodiment. Since the structure is otherwise the same as the second embodiment, description thereof will be omitted.

Fourth Embodiment

Figure 6:
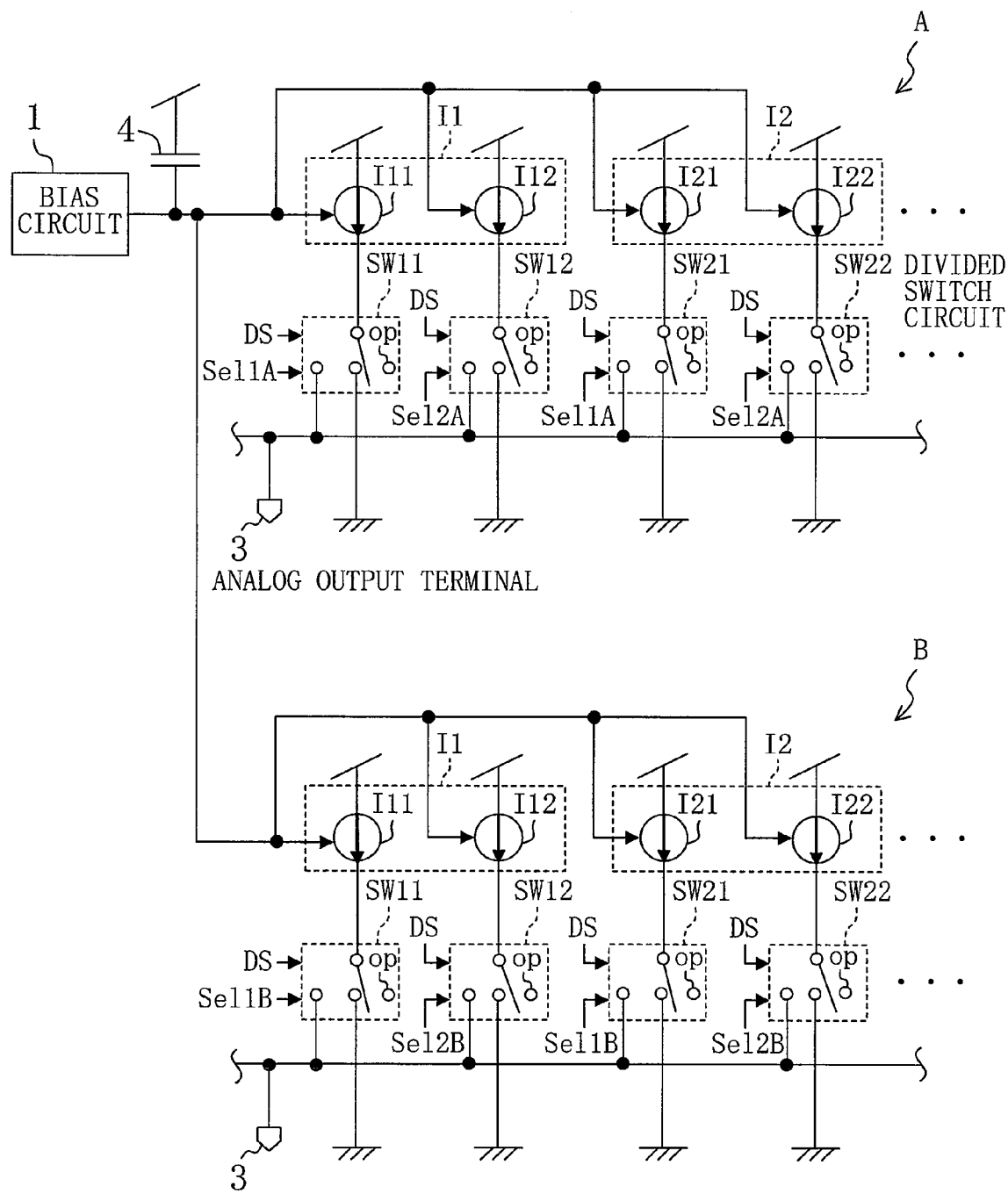
FIG. 6 shows the overall structure of a current steering DAC according to a fourth embodiment.

FIG. 6 shows the structure of a current steering DAC according to a fourth embodiment of the invention.

In this embodiment, the selection circuits Sa1, Sa2, . . . as shown in FIG. 1 are not provided. Instead, a switch circuit SW has the functions of the selection circuits.

More specifically, in the current steering DAC of FIG. 6, divided switch circuits SW11, SW12, SW21, SW22, . . . are connected in series with divided current sources I11, I12, I21, I22, . . . , respectively. Each divided switch circuit SW11, . . . has an open terminal op that is not connected to anything. According to a digital input signal DS and an on/off selection signal Sel1A, Sel2A, each divided switch circuit SW11, . . . switches a corresponding divided current source I11, . . . between an analog output terminal 3 and the ground or contacts the open terminal op so as not to switch the corresponding divided current source I11, . . . to the analog output terminal 2 nor the ground.

Figure 7:
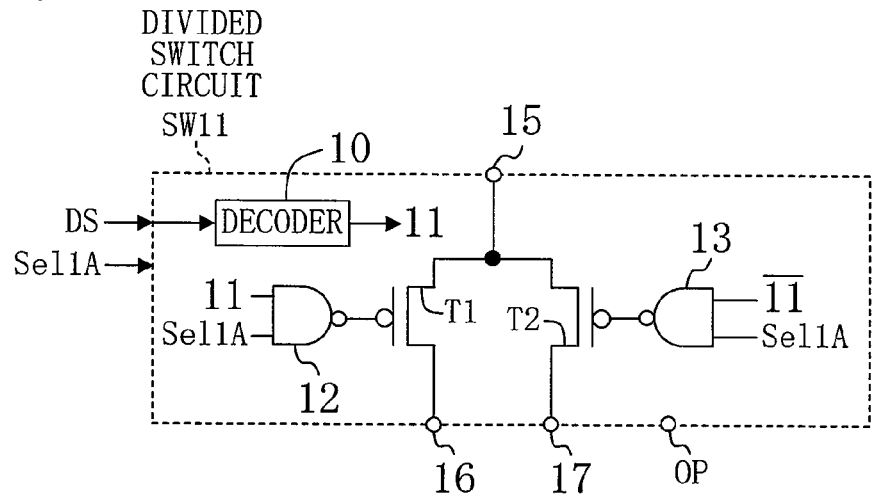
FIG. 7 specifically shows the structure of a switch circuit in the current steering DAC of the fourth embodiment.
Figure 8:
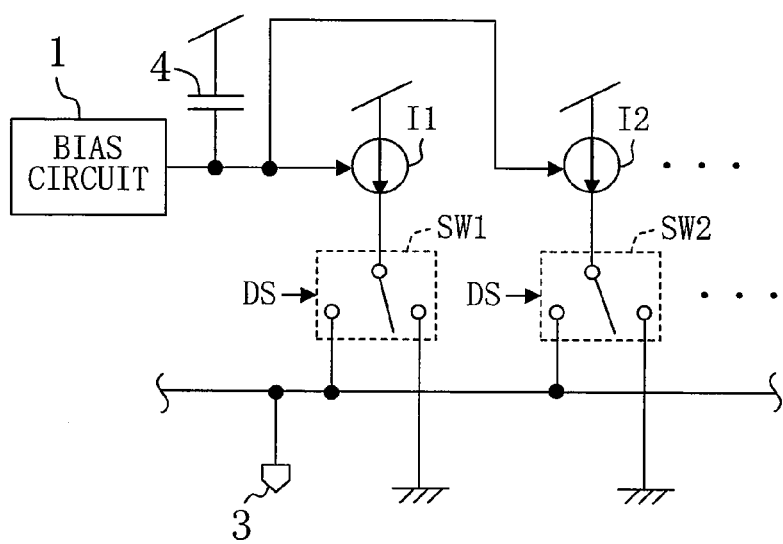
FIG. 8 shows the overall structure of a conventional current steering DAC.
Figure 9:
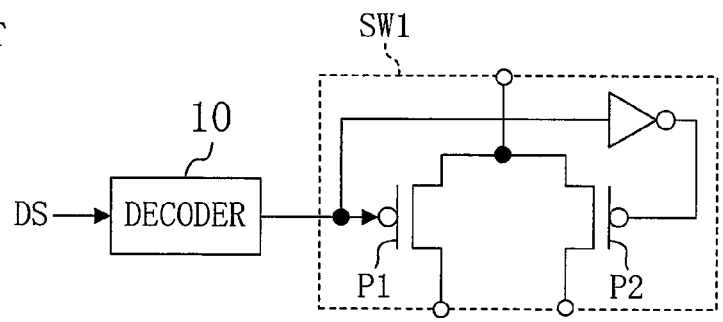
FIG. 9 shows the structure of a switch circuit in the conventional current steering DAC.
Figure 10:
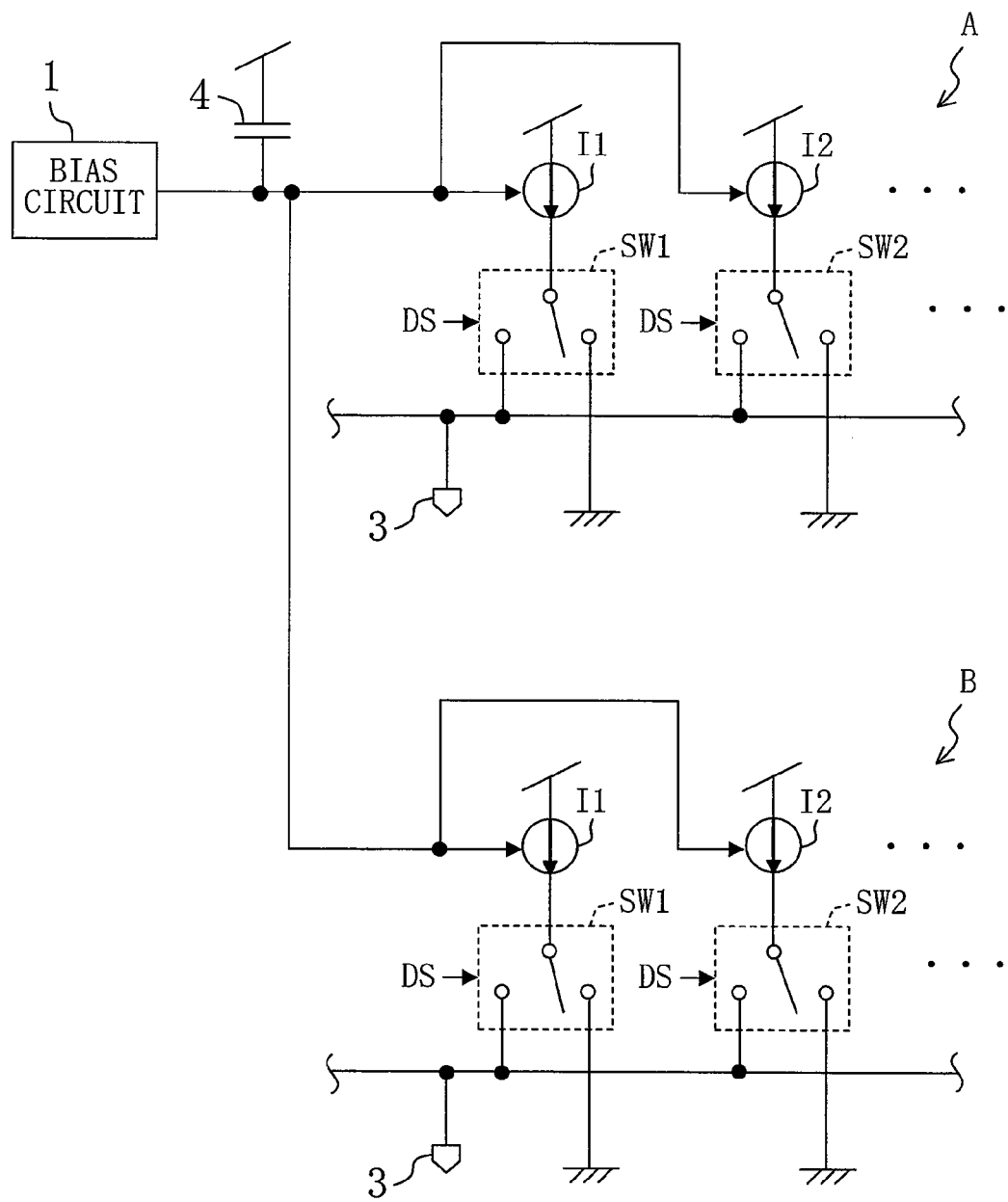
FIG. 10 shows the overall structure of a conventional 2-channel current steering DAC.

The plurality of divided switch circuits SW11, SW12, . . . have the same structure. FIG. 7 shows an internal structure of the divided switch circuit SW11. In FIG. 7, the divided switch circuit SW11 includes a decoder 10, a first NAND circuit (logic circuit) 12, a second NAND circuit (logic circuit) 13, and first and second Pch transistors T1, T2. The decoder 10 decodes a digital input signal DS. The first NAND circuit 12 receives a corresponding value of a decoded digital signal 11 from the decoder 10 and an on/off selection signal Sel1A. The second NAND circuit 13 receives an inverted signal of the decoded digital signal 11 and the on/off selection signal Sel1A. The respective sources of the Pch transistors T1, T2 are connected to a first terminal 15 connected to the first divided current source I11. The drain of the first Pch transistor T1 is connected to a second terminal 16 connected to the analog output terminal 3. The drain of the second Pch transistor T1 is connected to a third terminal 17 connected to the ground. An output signal of the first NAND circuit 12 is applied to the gate of the first Pch transistor T1. An output signal of the second NAND circuit 13 is applied to the gate of the second Pch transistor T2.

Accordingly, the divided switch circuit SW11 operates as follows: in the case where the on/off selection signal Sel1A is High and a corresponding value of the digital signal 11 is at "H" level, the first Pch transistor T1 is turned on and the first terminal 15 is connected to the second terminal 16 to the analog output terminal 3. In the case where the on/off selection signal Sel1A is High and a corresponding value of the digital signal 11 is at "L" level, the first terminal 15 is connected to the third terminal 17 to the ground. On the other hand, in the case where the on/off selection signal Sel1A is Low, the first terminal 15 is connected neither the first terminal 16 nor the second terminal 17. In other words, the first terminal 15 is connected to the open terminal op and the first divided current source I11 is turned off.

In the current steering DAC of this embodiment, the divided current sources I11, . . . can be turned on/off by switching the divided switch circuits SW11, . . . respectively corresponding to the divided current sources I11, . . . to the open terminal op. Therefore, a full-scale current of each channel A, B can be adjusted and unnecessary power consumption can be reduced.

In this embodiment, all of the divided switch circuits SW11, . . . have the structure shown in FIG. 7. However, only the first divided current sources I11, I21, . . . may have the structure of FIG. 7.

In the first through fourth embodiments, the current values of the first divided current sources I11, I21, . . . and the second divided current sources I12, I22, . . . are set to the same values. However, the invention is not limited to this, and the current values of the first divided current sources I11, I12, . . . and the second divided current sources I12, I22, . . . may be set to any values such as I11=I21=I12/2=I22/2. By setting the current value of each divided current source as appropriate, the full-scale current can be set to any value such as one-third value and can have three or more modes.

Each unit current source I1, I2, . . . has two divided current sources in this embodiment. However, it should be understood that each unit current source may have three or more divided current sources. It should also be understood that the number of channels is not limited to two and may be three or more.

In the above description, the two channels A, B have the same structure. However, the invention is not limited to this, and at least one of the plurality of channels need only have divided current sources and a control circuit.

A multi-channel current steering DAC is described above. However, the invention is also applicable to a single-channel current steering DAC. In this case, a full-scale current can be variably adjusted only by the control signals Sel1A, Sel2A of the internal control circuit 7 without changing the bias voltage BS of the bias circuit 1. Moreover, since the bias voltage BS is not changed, it is not necessary to charge and discharge the capacitor for stabilizing the bias voltage BS, and the full-scale current can be changed within a short time.

INDUSTRIAL APPLICABILITY

As has been described above, the invention is capable of adjusting a full-scale current of each channel without degrading the resolution. Therefore, the invention is useful as a multi-channel current steering DAC capable of reducing unnecessary power consumption.

What is claimed is:

1. A current steering DAC having a plurality of channels and including in each channel a plurality of unit current sources corresponding to a number of bits of a digital input signal, for, in each channel, selecting the plurality of unit current sources according to a value of the digital input signal and outputting a sum of currents of the selected unit current sources from an analog output terminal, the current steering DAC comprising:
a bias circuit shared by the plurality of channels, for generating a bias voltage for setting a current value of the plurality of unit current sources, wherein
in at least one of the plurality of channels, each of the plurality of unit current sources is formed by a plurality of divided current sources and the current steering DAC comprises: a plurality of cascode portions respectively corresponding to the divided current sources; and a control circuit for controlling the cascode portions so as to turn off at least one of the plurality of divided current sources in each unit current source.

2. The current steering DAC according to claim 1, wherein the plurality of divided current sources of each unit current source have a same current value.

3. The current steering DAC according to claim 1, wherein the plurality of divided current sources of each unit current source have different current values.

4. The current steering DAC according to claim 1, wherein each unit current source is formed by two divided current sources.

5. The current steering DAC according to claim 1, wherein the bias circuit applies the bias voltage to the plurality of divided current sources of each unit current source, and the control circuit includes a selection circuit for stopping supply of the bias voltage from the bias circuit to at least one of the plurality of cascode portions in each unit current source.

6. The current steering DAC according to claim 1, wherein each divided current source is formed by a P-type transistor connected to a power supply of a prescribed power supply voltage, each cascode portion is formed by a P-type transistor connected to a corresponding divided current source, and the control circuit includes a selection circuit for supplying an on-bias voltage for turning on the P-type transistor and an off-bias voltage for turning off the P-type transistor to the P-type transistor of each divided current source.

7. The current steering DAC according to claim 6, wherein the off-bias voltage that is supplied from the control circuit to the P-type transistor is the power supply voltage of the power supply.

8. The current steering DAC according to claim 1, wherein each divided current source is formed by an N-type transistor connected to a ground power supply, each cascode portion is formed by an N-type transistor connected to a corresponding divided current source, and the control circuit includes a selection circuit for supplying an on-bias voltage for turning on the N-type transistor and an off-bias voltage for turning off the N-type transistor to the N-type transistor of each divided current source.

9. The current steering DAC according to claim 8, wherein the off-bias voltage that is supplied from the control circuit to the N-type transistor is a ground voltage of the ground power supply.

10. A current steering DAC including a plurality of unit current sources corresponding to a number of bits of a digital input signal, for selecting the plurality of unit current sources according to a value of the digital input signal and outputting a sum of currents of the selected unit current sources from an analog output terminal, the current steering DAC comprising:

a bias circuit for generating a bias voltage for setting a current value of the plurality of unit current sources, wherein each of the plurality of unit current sources is formed by a plurality of divided current sources, the current steering DAC further comprising:

a plurality of cascode portions respectively corresponding to the divided current sources; and a control circuit for controlling the cascode portions so as to turn off at least one of the plurality of divided current sources in each unit current source.

* * * * *

UNITED STATES PATENT AND TRADEMARK OFFICE
CERTIFICATE OF CORRECTION

PATENT NO. : 7,701,373 B2  Page 1 of 1
APPLICATION NO. : 12/089699
DATED : April 20, 2010
INVENTOR(S) : Michiko Tokumaru et al.

It is certified that error appears in the above-identified patent and that said Letters Patent is hereby corrected as shown below:

ON THE TITLE PAGE OF THE PATENT:

Insert Item -- (30) Foreign Application Priority Data

October 17, 2005 (JP)........2005-301356 -- after "PRIOR PUBLICATION DATA"
and prior to "(51) INT. CL."

Signed and Sealed this

Twenty-sixth Day of October, 2010

David J. Kappos
*Director of the United States Patent and Trademark Office*